United States Patent [19]

Sanchez et al.

[11] Patent Number: 5,709,783
[45] Date of Patent: Jan. 20, 1998

US005709783A

[54] PREPARATION OF SPUTTERING TARGETS

[75] Inventors: Lloyd E. Sanchez, Huntington Beach; Arthur J. McDonald, Fountain Valley, both of Calif.

[73] Assignee: McDonnell Douglas Corporation, Long Beach, Calif.

[21] Appl. No.: 414,597

[22] Filed: Mar. 31, 1995

Related U.S. Application Data

[63] Continuation of Ser. No. 154,106, Nov. 18, 1993, abandoned.

[51] Int. Cl.$^6$ .................... C23C 14/34; C03B 29/00; C04B 33/34; B29D 7/00
[52] U.S. Cl. .................. 204/192.18; 204/192.1; 204/192.15; 204/298.13; 156/89; 264/61; 264/212
[58] Field of Search .................. 204/192.1, 192.15, 204/192.18, 248.12, 248.13; 156/89; 264/61, 212

[56] References Cited

U.S. PATENT DOCUMENTS

| | | | |
|---|---|---|---|
| 3,518,756 | 7/1970 | Bennett et al. | 29/846 |
| 3,695,960 | 10/1972 | Richter | 156/89 |
| 5,091,221 | 2/1992 | Chu et al. | 204/298.13 |
| 5,162,977 | 11/1992 | Paurus et al. | 361/401 |
| 5,507,898 | 4/1996 | Aoki et al. | 156/89 |

FOREIGN PATENT DOCUMENTS 3-166366  7/1991  Japan .................. 204/298.13

OTHER PUBLICATIONS

L.E. Sanchez, D.T. Dionk, S.Y. Wu, and I.K. Naik; "Processing And Characterization of Sol-Gel Derived Very Thin Film Ferroelectric Capacitors"; *Ferroelectrics*, 1991, vol. 116, pp. 1–17.

Primary Examiner—Robert Kunemund
Assistant Examiner—Rodney G. McDonald
Attorney, Agent, or Firm—The Bell Seltzer Intellectual Property Law Gropu of Alston & Bird LLP

[57] ABSTRACT

Method for preparing sputtering targets according to one embodiment, by reacting a mixture of alkoxides of metals such as titanium, lanthanum and zirconium, with a soluble lead compound such as lead acetate in an organic solvent in the presence of aqueous ammonium hydroxide, to form a sol-gel. The solvent is removed from the sol-gel to form a powder. The powder is mixed with a liquid medium, e.g. an aqueous medium containing an organosol, to form a slurry of the powder and the slurry is cast on a substrate such as a polyester tape and dried to form a tape of the sol-gel. The tape is cut into individual tapes and the tapes are stacked and laminated under heat and pressure into a monolithic unit, which is then filed at high temperature. The dense monolithic unit thus formed is mechanically machined to the desired shape, e.g. in the form of a circular disc, to produce a sputtering target.

25 Claims, No Drawings

PREPARATION OF SPUTTERING TARGETS

RELATED APPLICATION

This application is a continuation of our U.S. patent application Ser. No. 08/154,106, filed Nov. 18, 1993 entitled "Preparation of Sputtering Targets", abandoned.

BACKGROUND OF THE INVENTION

This invention relates to the production of improved sputtering targets, and is particularly concerned with the preparation of sputtering targets employing sol-gel processing of liquid metalo-organic precursors, e.g. zirconium and titanium isopropoxide reacted with lead acetate, to form an oxide powder having the required proportions of the respective metal components.

Sputtering targets are used in high vacuum systems as a source of material from which are made items such at ferroelectric memory chips on gallium arsenide or silicon substrates, and electro optic devices such as shutters, modulators and wave guides.

The materials used to make sputtering targets depend on the item being manufactured. All of the items noted above can be made from the sputtering targets PZT (lead zirconate titanate), PLZT (lead lanthanum zirconate titanate), BT (barium titanate) or BST (barium strontium titanate). Sputtering is accomplished under high vacuum by directing a beam of inert gas ions such as argon, and oxygen ions in such a way that they impact on the sputtering target and "knock off" multi molecular segments from the target. These segments then deposit on the substrate material (GaAs or Si) uniformly such that they create a usable thin film of from 500 Å to 10000 Å or 1 µm thick.

Sputtering targets presently used for ferroelectric PZT are made by pressing oxide powders of each metal element lead, zirconium and titanium, grinding, sintering, evaluating, and then repeating the cycle of grinding, sintering and evaluating until the target has a composition within the desired metal oxide ratios of each metal. This is time consuming and costly. Additionally, since the target is made from metal oxide powders, not molecular level compositions or mixtures of these metal oxides, the homogeneity of the resultant sputtered films may be poor.

Thus, for example, the end product, that is the sputtering target, is not completely uniform, mixed oxides existing as isolated "islands" between each other, and the resultant deposited film mirrors the sputtering target. The efficiency of the end product, for example, ferroelectic capacitor, electo-optic shutter and the like, is dependent on the composition of the sputtering target. It is accordingly common using present processing techniques described above for the target to have a composition different from that which was intended.

In U.S. application Ser. No. 149,357, filed Jan. 28, 1988, of L. E. Sanchez, and assigned to the same assignee as the present application, a silica "green" tape is produced by dispersing spherical silica particles ranging in size from 0.1 to 2 microns, in a liquid containing dissolved organic binders, particularly in the form of an organosol, and plasticizing modifiers, all diluted in a solvent system and forming a sol-gel. The resulting slip or slurry is cast on a suitable substrate, such as a polyester sheet, the tape is dried and the solvent evaporated, resulting in a silica "green" tape. The resulting silica "green" tape is cut into individual tapes, a circuit pattern is screened onto each tape and the polyester backing is removed from the tapes. The screened silica "green" tapes are then collated, registered and stacked and the layer stack is then laminated. The resulting monolithic unit is then fired at temperature of about 1050° C. to form a multilayer circuit board.

It is an object of the present invention to provide an improved sputtering target.

Another object is the provision of an improved sputtering target formed by reacting liquid metalo-organic precursors to form a sol-gel which is further processed to provide a sputtering target formed of mixed oxides of the metals of the precursors, in desired proportions.

Yet another object is to provide procedure for producing improved sputtering targets, e.g. of PZT, PLZT, BT and BST.

Other objects and advantages will appear hereinafter.

SUMMARY OF THE INVENTION

It has been found according to one embodiment that the use of organometallic precursors such as a mixture of a titanium alkoxide and a zirconium alkoxide or a barium alkoxide, with or without other metal compounds such as a soluble lead compound, e.g. lead acetate, in the presence of water and ammonium hydroxide, leads to a hydrolyzation and condensation reaction, which results in the formation of sol-gels. These sol-gels when dried and fired at high temperature result in homogeneous, molecularly mixed metal oxide materials such as lead zirconate titanate or barium titanate. In order to provide the desired mechanical form of sputtering target, e.g. round, and of a required thickness, the sol-gel material is dried to a powder, then mixed with organic binders, plasticizers and solvents, and the resulting "slip" is then cast as "green", e.g. PZT, tape which can be cut and stacked, laminated under pressure and temperature and fired. The resultant blank is then mechanically machined into the desired shape to form the sputtering target.

Thus, according to the invention, a method for preparing sputtering targets is provided which comprises reacting organometallic precursors in the form of alkoxides of a metal selected from the group consisting of titanium, lanthanum, strontium, zirconium and barium, and mixtures thereof, with a soluble lead compound in the case of titanium, lanthanum and zirconium alkoxides, in an organic solvent, and in the presence of aqueous ammonium hydroxide, to form a sol-gel, removing the solvent from the sol-gel and forming a powder, mixing the powder with an aqueous medium containing an organosol, to form a slurry of the powder, casting the slurry on a support substrate, drying the slurry to form a tape of said sol-gel, forming a plurality of such tapes into layers of a stack, laminating the stack of layers, firing the laminated stack at elevated temperature to form a monolithic structure, and mechanically forming such monolithic structure into a sputtering target of a desired shape.

Where a lead compound such as lead zirconium titanate is desired in the sol-gel, barium and strontium alkoxides are not utilized. Where a barium compound such as barium titanate or barium strontium titanate is desired, only barium, titanium and strontium alkoxides are employed, in the absence of a lead compound.

The essence of the invention is in the reaction of the organometallic precursors, with or without another metal compound such as lead acetate, to form a sol-gel, which can then be cast into a tape, and which can be processed by laminating and firing to produce a blank which can be mechanically machined into a sputtering target. This distinguishes from the prior art wherein a mixture of the ceramic oxides are compressed into a billet, which is then fired to form a monolithic unit and which is then machined into a sputtering target. However, the resulting prior art target often results in a nonhomogeneous and different composition of the respective metallic oxides than that desired.

The process of the present invention has the advantages of ease of manufacturing which results in shorter lead times and lower cost, while obtaining a uniform sputtering target composition of molecularly mixed metal oxides, leading to more homogeneous deposited films of the desired predetermined composition.

DETAILED DESCRIPTION OF THE INVENTION AND PREFERRED EMBODIMENTS

As previously noted, a sol-gel is first formed in the process of preparing a sputtering target according to the invention by reacting certain organometallic precursors with or without a soluble lead compound in an organic solvent and in the presence of aqueous ammonium hydroxide.

The organometallic precursors are in the form of alkoxides of a metal selected from the group consisting of titanium, lanthanum, strontium, zirconium and barium, and mixtures thereof. The alkyl group of the alkoxides employed contain from 1 to 4 carbon atoms. These include methoxides, ethoxides, propoxides and butoxides. Specific examples of such organometallic precursors are as follows:

Titanium n-butoxide

Titanium ethoxide

Titanium isopropoxide

Titanium methoxide

Lanthanum methoxyethoxide

Lanthanum isopropoxide

Zirconium n-butoxide

Zirconium ethoxide

Strontium methoxy propoxide

Strontium isopropoxide

Zirconium isopropoxide

Barium isopropoxide

Barium methoxy propoxide

Generally, and preferably, mixtures of the above organometallic precursors are employed, such as a mixture of zirconium and titanium alkoxides, a mixture of zirconium, titanium and lanthanum alkoxides, a mixture of barium and titanium alkoxides and a mixture of barium, strontium and titanium alkoxides.

The soluble lead compound which is reacted with certain of the above organometallic precursors is preferably lead II acetate. Any suitable soluble lead compound can be employed. However some soluble lead compounds such as lead chloride should not be used because of the presence of chlorine when it is fired. As previously noted, a soluble lead compound is not employed where barium and strontium alkoxides are utilized to obtain barium titanium or barium strontium titanate sol-gel.

The solvents preferably employed for the reaction include alcohols and chlorinated hydrocarbons, specific examples of which are the following:

Methyl alcohol

Ethyl alcohol 2-methoxy ethanol

Isopropyl alcohol n-propyl alcohol trichloroethane

Although the above solvents are preferred, other suitable organic solvents can be employed.

The reaction is generally carried out in the presence of aqueous ammonium hydroxide and under normal temperature conditions and the period of reaction can be from about 1 to about 24 hours.

The result of the reaction is the formation of a colloid or sol-gel, wherein the sol-gel comprises a mixture of oxides of the metals of the precursor alkoxides, and lead, when employed, e.g. in the form of titanates, e.g. a mixture of lead, zirconium and titanium oxides, i.e. in the form of lead zirconate titanate, or a mixture of barium and titanium oxides, i.e. in the form of barium titanate. The solvents are removed from the sol-gel by evaporation or vacuum distillation and drying at temperatures, e.g. ranging from about 80° to about 90° C.

The resulting material is in the form of a powder and the mixture of metals present in the powder can be a combination of lead oxide and other metal oxides formed from the organometallic alkoxide precursor, such as zirconium oxide and titanium oxide, e.g. in the form of the zirconate or titanate. Preferred materials of this type are PZT, lead zirconate titanate, and PLZT, lead lanthanum zirconate titanate. Where the organometallic precursor is a barium alkoxide, and in the absence of any lead compound, preferred resulting materials are BT, barium titanate, and BST barium strontium titanate. The proportions of organometallic precursors and soluble lead compound employed in the reaction are such that the metal oxides in the resulting sol-gel have the desired proportions.

Thus, for PZT the metals of the metal oxides in the sol-gel, based on 100% metallic content are at least about 50% lead, the balance based on the sum of the zirconium and titanium being about 30 to about 70% zirconium, and about 70 to about 30% titanium, by weight, excluding the oxide content. For PLZT, the metals of the metal oxides in the sol-gel, based on 100% metallic content are about 50% of the sum of lanthanum and lead containing about 5 to about 15% lanthanum and about 45 to about 35% lead, and about 50% of the sum of zirconium and titanium containing about 10 to about 40% zirconium and about 40 to about 10% titanium, by weight, excluding the oxide content. For BT the metals of the metal oxides in the sol-gel are a mixture of barium and titanium oxides containing about 30 to about 70% barium and about 70 to about 30% titanium, by weight, based on 100% of the metallic content and for BST a mixture of barium, strontium and titanium oxides containing about 50% barium and about 50% of the sum of strontium and titanium including about 10 to about 30% strontium and about 40 to about 20% titanium, by weight, based on 100% of the metallic content.

Where a lead compound is employed in the reaction, it is preferable to employ an excess of soluble lead compound in order to maintain the stoichiometry, since lead oxide in the sol-gel and which is subsequently subjected to firing tends to evaporate.

The sol-gel obtained in the above reaction and following removal of solvent and drying, is in the form of a very filmy network of dry low density powder. The resulting powder of the sol-gel reaction is formed into a slip or casting slurry by dispering the powder in a high volume of a liquid medium, preferably containing a binder. According to one preferred embodiment the liquid medium consists essentially of an organosol as binder and preferably also contains a material which functions as a plasticizer or lubricant, as well as a dispersant. These materials are employed in a water-based system.

The organosol is in the form of a vinyl acetate-acrylic copolymer emulsion, which is a latex-type suspension of polymer material in water, a material of this type being marketed by Monsanto as "Gelva" emulsion resin. It has been found that this organosol is a binder that can be used effectively with the powder to cast the improved "green" tape of the invention containing the ceramic powder. The vinyl acetate-acrylic copolymer should have a suitable molecular weight, preferably ranging from about 2,000 to about 10,000.

Polyethylene glycol (PEG) is added to the organosol as a plasticizer. The PEG should have a molecular weight smaller than 10,000; otherwise, if the molecular weight is higher, it has been found that the resulting "green" tape commences to crack. In preferred practice, the PEG has a molecular weight ranging from about 4,000 to about 6,000. both the organosol and the PEG are water soluble, and these materials form a solution in water. The PEG acts as a dispersant as well as a plasticizer.

The ceramic powder is added to the above-noted liquid medium. The amount of PEG employed is sufficient to maintain the resulting "green" tape flexible and is generally in a range of about 1 to about 6% by weight of the organosol binder.

Alternatively, the liquid medium can contain polyvinyl butyral as binder, isopropyl alcohol and trichloroethane as solvents, polyethylene glycol preferably having the molecular weight noted above, and di-octyl phthalate as plasticizers, and corn oil as lubricant.

As a further alternative, the liquid medium can comprise the proprietary binder system based on acrylic resin and xylene as solvent, and containing plasticizers and defoaming agents, marketed as TAM73131 by TAM Corporation.

The slip or slurry containing the dispersed ceramic powder is then cast into a tape by spreading it on a flat substrate surface, such as a polyester (Mylar) or cellulose acetate film. Other substrates, such as stainless steel, can also be employed. A doctor blade is used in casting the film of slurry to a desired thickness.

The substrate containing the slurry film dispersion of ceramic particles is then dried at temperature which can range from room temperature to about 60° C. It is desirable to accelerate drying, but skinning and trapped gas bubbles result if the slurry film is dried too rapidly The thickness of the dried tape can range from about 0.002" to about 0.05". The higher the loading of the ceramic-containing mixture on the substrate, the thicker the cast dried film. The resultant "green" tape does not crack during drying.

After drying, the ceramic "green" tape is cut into predetermined sizes. The substrate, e.g. polyester substrate, can be removed at this point or subsequently. In preferred practice, it is removed from the tapes prior to lamination.

The resulting tapes are stacked, and the stack of layers is then laminated together into a monolithic "green" unit, by heating the stack under pressure, e.g. at 60° C. and at a pressure of 500–1500 psi.

The layers of "green" tape forming the monolithic "green" laminate unit are then co-fired at a temperature of about 1000° C. to 1250° C., e.g. for a period of about 1–24 hours. During firing, the binder, e.g. the vinyl-acetate-acrylic copolymer binder is decomposed and driven off. The firing atmosphere must be oxidizing, i.e. in the presence of $O_2$ in order to remove organic constituents and to prevent the lead component which will exist as an oxide when present from reducing to elemental lead.

It is noted that upon firing the laminate the density of the material increases and the unit becomes a solid monolithic mass.

After firing, the fired ceramic substrate in the form of a monolithic structure is then re-surfaced by common lapping techniques. In such lapping methods, for example slurries of silicon carbide, aluminas, and the like are used to slowly abrade the surface of the monolithic unit until it achieves a planar or plate surface. Mechanical methods are then employed for rendering the monolithic structure into a circular shape. This is accomplished for example by employing a lathe to machine a round circular form from the monolithic structure. The net result is a sputtering target which can be for example circular disks of from about 2 to about 12 inches in diameter and 0.25 to 1 inch thick.

The resulting sputtering targets are employed in a method of depositing thin films of different materials on for example a gallium arsenide or silicon substrate or any other type of substrate. In a vacuum chamber, the sputtering target is bombarded with atoms of argon or helium or some other inert gas. This results in knocking off molecules of the target to deposit films of the sputtering target composition on the above noted substrates. Thus, for example, sputtering targets of PZT or PLZT can be used in making capacitors for ferroelectric use (for non-volatile memories) or such sputtering targets can be employed for making shutters, for example that will block light when they are biased.

The following are examples of practice of the invention:

EXAMPLE 1

3000 ml of isopropyl alcohol is placed in a reactant vessel, which can be glass, ceramic or plastic. 375 cc ammonium hydroxide of about 28% concentration by weight is added to maintain the pH of the solution at 10 or greater.

In a separate container 100 grams lead II acetate is added and approximately 300 ml of 2-methoxy ethanol is added. 2-methoxy ethanol is used as a solvent for lead acetate, since the solubility of lead acetate in isopropyl alcohol is limited. Approximately 150 ml of the 2-methoxy ethanol component is distilled off and discarded, and is replaced by an additional 150 ml of the 2-methoxy ethanol component. This operation is repeated 3 times. This is done in order to remove water from the lead acetate solution, since lead acetate exists as a hydrate.

To the container of the lead acetate solution is added 6.8 gm lanthanum isopropoxide, the quantity being dependent on the desired composition of the end product as in the case of the ratios of the other metal oxides. The resulting solution is separated into equal portions in separate containers. To one container of such solution is added 22.5 gm of titanium isopropoxide and the solution mixed, and to the other container is added 52 gms of zirconium isopropoxide with stirring. Both portions are then mixed into a single container.

The resulting lead/lanthanum/titanium/zirconium solution is added to the isopropyl alcohol/ammonium hydroxide mixture in the first container, while stirring. The mixture is stirred continuously for 8 to 12 hours, forming a sol-gel. The solvents are removed from the sol-gel by distillation or evaporation and the residue dried at 80°–90° C. to form a filmy dry powder of PLZT.

The resulting ceramic powder is formed into a slip or casting slurry by dispersing 300 grams of the powder in 150 grams of a vinyl acetate-acrylic copolymer emulsion (Monsanto Gelva emulsion resin GS-100) and 9 grams polyethylene glycol (PEG), molecular weight 4000–6000 is added to the ceramic powder acetate-acrylic copolymer emulsion.

The resulting slip is then cast into a tape by spreading the slip on Mylar tape using a doctor blade dispenses. The substrate containing the slurry film dispersion of ceramic particles is then dried at a temperature of about 60° C., the resulting tape having a thickness of about 0.05 inch. After drying, the ceramic "green" tape is cut into predetermined size and the tapes are stripped from the Mylar substrates and stacked in the form of layers. The layers are then laminated together into a monolithic "green" unit, by heating the stack under pressure of about 1000 psi and at 60° C.

After lamination, the monolithic laminate unit is then fired in air. Such firing takes place at a temperature of about 1200° C. and held at this temperature for a period of 4 hours. The firing atmosphere must be oxidizing, i.e. in the presence of oxygen, in order to remove the organic components and to prevent the lead oxide component of the monolithic unit from decomposing.

The resulting fired monolithic unit is then re-surfaced by a lapping technique, and formed by mechanical means into a PLZT sputtering target of flat circular shape of about 8 inches in diameter and 0.25 inch thick.

EXAMPLE 2

The procedure of Example 1 is essentially followed except that no lanthanum isopropoxide is employed in the organometallic mixture utilized in producing the sol-gel, and the dry powder formed by evaporation of the solvent from the sol-gel is PZT.

The sol-gel is processed as in Example 1 to produce a PZT sputtering target.

EXAMPLE 3

Into 3000 cc of undenatured absolute ethyl alcohol are added 255.5 grams barium isopropoxide and 234.25 grams titanium isopropoxide. While stirring briskly, 375 cc of reagent grade ammonium hydroxide is added to the solution. The mixture is allowed to react completely, while stirring for 4 hours, forming a sol-gel.

The alcohol solvent is removed from the resulting sol-gel by vacuum distillation, and the resulting residue or powder of BT is dried completely at 200° C. for 4 hours.

The remaining procedure is carried out substantially in the same manner as in Example 1 to form a sputtering target from the BT powder.

EXAMPLE 4

Into 3000 ml of undenatured absolute ethyl alcohol are added 51.1 grams of barium isopropoxide, 164.64 grams of strontium isopropoxide and 284 grams of titanium isopropoxide. While stirring briskly, 375 ml of reagent grade ammonium hydroxide is added to the solution. The mixture is allowed to react completely while stirring for 4 hours.

The alcohol solvent is removed from the resulting sol-gel by vacuum distillation, and the resulting residue or powder of BST is dried completely at 200° C. for 4 hours.

The remaining procedure is carried out substantially in the same manner as in Example 1 to form a sputtering target from the BST powder.

EXAMPLE 5

The procedure Of Example 1 is followed, except in place of the organosol binder of Example 1, there is substituted the binder system formed of a mixture of the following components in the amounts noted in the Table below.

TABLE

| Component | Weight (grams) |
|---|---|
| Isopropyl alcohol | 540 |
| Trichloroethane | 125 |
| Corn oil | 90 |
| Polyvinyl butyral | 180 |
| Polyethylene glycol | 120 |
| Dioctyl phthalate | 120 |

300 grams of the PLZT powder formed in Example 1 is dispersed in the binder mixture of the above Table and formed into a casting slip, and further processed as in Example 1 into a PLZT sputtering target.

EXAMPLE 6

The procedure of Example 1 is followed, except in place of the organosol binder of Example 1, there is substituted the binder system TAM 73131, in which all of the components are premixed.

300 grams of the PLZT powder formed in Example 1 is dispersed in 366 grams of the TAM 73131 binder system and formed into a casting slip, and further processed as in Example 1 into a PLZT sputtering target.

From the foregoing, it is seen that the invention provides an improved method for the preparation of sputtering targets employing organometallic precursors and in a reaction under conditions which produces a sol-gel, and the ceramic powder obtained from the gel is then processed into tapes which are stacked and laminated and then fired to form a monolithic Knit which is then sized by lapping and mechanical operations to form sputtering targets. The method of the invention has the features of ease of manufacture and lower cost, and obtaining sputtering targets of metal oxides having greater homogeneity and a predetermined desired composition of the metallic oxide components.

Since various changes and modifications of the invention will occur to those skilled in the art within the spirit of the invention, the invention is not to be taken as limited except by the scope of the appended claims.

What is claimed is:

1. A method for preparing a sputtering target which sputters out atoms when bombarded by ions in a sputtering environment to produce ferroelectric capacitors and which comprises:

reacting organometallic precursor alkoxides of a metal selected from the group consisting of titanium, lanthanum, strontium, zirconium, barium, and mixtures thereof, with a soluble lead compound, in predetermined stoichiometric ratios and in an organic solvent, and in the presence of aqueous ammonium hydroxide, to form a sol-gel with corresponding molecular stoichiometric ratios, removing the solvent from said sol-gel resulting in the formation of a powder of said sol-gel, mixing said powder with a liquid medium to form a slurry of said powder, casting said slurry on a support substrate, drying said slurry to form a plurality of tapes of said sol-gel, forming said plurality of said tapes into layers of a stack, laminating the stack of layers, firing said laminated stack at a temperature in an oxidizing atmosphere sufficient to completely drive off any binder with may be present to form a monolithic homogenous molecularly mixed metal oxide material structure but at a temperature sufficient to avoid compromising the efficiency of the monolithic material structure, and mechanically forming said monolithic structure into a sputtering target of a desired shape such that the target is placed in a selected sputtering environment and bombarded by ions to sputter out ferroelectric atoms for depositing thin films of the monolithic structure on a substrate and in corresponding stoichiometric ratios.

2. A method for preparing a sputtering target which sputters out atoms when bombarded by ions in a sputtering environment to produce a ferroelectric capacitor and which comprises:

contacting organometallic precursor alkoxides of a metal selected from the group consisting of titanium, strontium, barium, and mixtures thereof, in predetermined stoichiometric ratios with an organic solvent, and in the presence of aqueous ammonium hydroxide, to form a sol-gel with corresponding molecular stoichiometric ratios, removing the solvent from said sol-gel resulting in the formation of a powder of said sol-gel, mixing said powder with a liquid medium to form a slurry of said powder, casting said slurry on a support substrate, drying said slurry to form a plurality of tapes of said sol-gel, forming said plurality of said tapes into layers of a stack, laminating the stack of layers, firing said laminated stack at a temperature in an oxidizing atmosphere sufficient to completely drive off any binder which may be present to form a monolithic structure but at a temperature sufficient to avoid compromising the efficiency of the monolithic material structure, and mechanically forming said monolithic structure into a sputtering target of a desired shape such that the target is placed in a selected sputtering environment and bombarded by ions to sputter out ferroelectric atoms for depositing thin films of the monolithic structure on a substrate in corresponding stoichiometric ratios.

3. The method of claim 1, wherein said alkoxides have an alkyl group which contains from 1 to 4 carbon atoms.

4. The method of claim 3, wherein said alkoxides are a mixture of zirconium alkoxide and a titanium alkoxide, and said lead compound is lead acetate, and the sol-gel formed in the reaction is a mixture of metal oxides including lead, zirconium and titanium oxides.

5. The method of claim 1, wherein the proportions of zirconium alkoxide, titanium alkoxide and lead acetate are such that the metals of the metal oxides in said sol-gel, based on 100% metallic content are at least about 50% lead, the balance based on a sum of the zirconium and titanium being about 30 to about 70% zirconium and about 70 to about 30% titanium, by weight, excluding oxide content of the metal oxides.

6. The method of claim 3, wherein said alkoxides are a mixture of a zirconium alkoxide, a lanthanum alkoxide and a titanium alkoxide, and said lead compound is lead acetate, and the sol-gel formed in the reaction is a mixture of metal oxides including lead, lanthanum, zirconium and titanium oxides.

7. The method of claim 6, where in the proportions of zirconium, lanthanum and titanium alkoxides and lead acetate are such that the metals of the metal oxides in said sol-gel, based on 100% metallic content are about 50% of a sum of lanthanum and lead containing about 5 to about 15% lanthanum and about 45 to about 35% lead, and about 50% of the sum of zirconium and titanium containing about 10 to about 40% and about 40 to about 10% titanium, by weight, excluding oxide content of the metal oxides.

8. The method of claim 2 wherein said alkoxides are a mixture of a barium alkoxide and a titanium alkoxide, and the sol-gel formed in the reaction is a mixture of barium and titanium oxides containing about 30 to about 70% barium and about 70 to about 30% titanium, by weight, based on 100% of the metallic content of said oxides.

9. The method of claim 2, wherein said alkoxides are a mixture of a barium alkoxide, a strontium alkoxide and a titanium alkoxide, and the sol-gel formed in the reaction is a mixture of barium, strontium and titanium oxides containing about 50% barium and about 50% of a sum of strontium an titanium including about 10 to about 30% strontium and about 40 to about 20% titanium, by weight, based on 100% of the metallic content.

10. The method of claim 1, wherein said reaction takes place at about ambient temperature.

11. The method of claim 1, wherein said liquid medium contains a binder.

12. The method of claim 1, wherein said liquid medium contains an organosol comprising a vinyl acetate-acrylic copolymer emulsion as a binder.

13. The method of claim 12, wherein said liquid medium also contains polyethylene glycol as plasticizer, said polyethylene glycol having a molecular weight not in excess of about 10,000.

14. The method of claim 13, wherein said polyethylene glycol has a molecular weight ranging from abut 4,000 to about 6,000.

15. The method of claim 1, wherein said liquid medium contains polyvinyl butyral as a binder.

16. The method of claim 15, wherein said liquid medium also contains an organic solvent selected from the group consisting of dioctyl phthalate and corn oil.

17. The method of claim 1, wherein said liquid medium contains an acrylic resin as binder and an organic solvent.

18. The method of claim 1, wherein said support for said cast slurry is a polyester film.

19. The method of claim 1, wherein said step of casting is carried out employing a doctor blade, and said drying taking place at elevated temperature not exceeding about 60° C.

20. The method of claim 1, wherein each of said tapes has a thickness ranging from about 0.002" to about 0.050".

21. The method of claim 1, wherein said stack of layers are laminated together into a monolithic unit by heating said stack under pressure of 500–1500 psi.

22. The method of claim 21, including firing said laminated stack at about 1,000° to about 1250° C. to form a monolithic structure.

23. The method of claim 22, said mechanical forming of said monolithic unit after firing including lapping said fired monolithic unit to provide a smooth surface and mechanically forming said unit into a predetermined shape of sputtering target.

24. A method for preparing a sputtering target which sputters out atoms when bombarded by ions in a sputtering environment to produce ferroelectric capacitors and which comprises:

reacting a mixture of zirconium and titanium alkoxides having alkyl groups which contain from 1 to 4 carbon atoms, with lead acetate in predetermined stoichiometric ratios and in an organic solvent and in the presence of aqueous ammonium hydroxide to form a sol-gel comprising a mixture of metal oxides including lead, zirconium and titanium oxides, wherein the proportions of zirconium alkoxide, titanium alkoxide and lead acetate are such that the metals of the metal oxides in said sol-gel, based on 100% metallic content are at least about 50% lead, the balance based on a sum of the zirconium and titanium being about 30 to about 70% zirconium and about 70 to 30% titanium, by weight, excluding oxide content of the metal oxides, removing the solvent from said sol-gel and forming a powder from the sol-gel with corresponding molecular stoichiometric ratios, mixing said powder with an aqueous medium containing an organosol comprising a vinyl acetate-acrylic copolymer emulsion as a binder, said aqueous medium also containing polyethylene glycol as plasticizer, said polyethylene glycol having a molecular weight ranging from about 4,000 to about 6,000, and forming a slurry, casting said slurry on a polyester substrate, drying said slurry from room temperature to about 60° C., to form a tape of said sol-gel, cutting said tape into predetermined sizes of tape segments, removing the polyester substrate from the predetermined sizes of said tape segments, stacking the tape segments and laminating the stack together by heating under pressure of 500–1500 psi, firing said monolithic unit at temperature of about 1000° C. to about 1250° C. in an oxidizing atmosphere to completely drive off any binder which may be present and thereby form a homogenous molecularly mixed metal oxide material monolithic unit while avoiding compromising the efficiency of the monolithic material unit, lapping said fired monolithic unit to provide a smooth surface, and mechanically forming said unit into a sputtering target of a desired shape such that the target is placed in a selected sputtering environment and bombarded by ions to sputter out atoms for depositing thin films of the monolithic unit on a substrate.

25. A method for preparing a sputtering target which sputters out ferroelectric atoms when bombarded by ions in a sputtering environment to produce ferroelectric capacitors and which comprises:

reacting a mixture of zirconium, lanthanum and titanium alkoxides having alkyl groups which contain from 1 to 4 carbon atoms in the alkyl group, with lead acetate in predetermined stoichiometric ratios and in an organic solvent and in the presence of aqueous ammonium hydroxide to form a sol-gel comprising a mixture of metal oxides including lead, lanthanum, zirconium and titanium oxides wherein the proportions of zirconium, lanthanum and titanium alkoxides and lead acetate are such that the metals of the metal oxides in said sol-gel, based on 100% metallic content are about 50% of a sum of lanthanum and lead containing about 5 to about 15% lanthanum and about 45 to about 35% lead, and about 50% of the sum of zirconium and titanium containing about 10 to about 40% zirconium and about 40 to about 10% titanium, by weight, excluding oxide content of the metal oxides, removing the solvent from, said sol-gel and forming a powder from said sol-gel, mixing said powder with an aqueous medium containing an organosol comprising a vinyl acetate-acrylic copolymer emulsion as binder, said aqueous medium also containing polyethylene glycol as plasticizer, said polyethylene glycol having a molecular weight ranging from about 4,000 to about 6,000, and forming a slurry, casting said slurry on a polyester substrate, drying said slurry from room temperature to about 60° C., to form a tape of said sol-gel, cutting said tape into predetermined sizes of tape segments, removing the polyester substrate from the predetermined sizes of the tape segments, stacking the resulting tape segments and laminating the stack together by heating under pressure of 500–1500 psi, into a monolithic unit, firing said monolithic unit at a temperature of about 1000° C. to about 1250° C. in an oxidizing atmosphere to completely drive off any binder which may be present and thereby form a homogenous molecularly mixed metal oxide material monolithic unit, lapping said fired monolithic unit to provide a smooth surface, and mechanically forming said unit into a sputtering target of desired shape such that the target is placed in a selected sputtering environment and bombarded by ions to sputter out atoms for depositing thin films of the monolithic unit on a substrate in corresponding stoichiometric ratios.

* * * * *